US011329102B2

(12) United States Patent
Yano

(10) Patent No.: US 11,329,102 B2
(45) Date of Patent: May 10, 2022

(54) RESISTIVE MEMORY DEVICE AND MANUFACTURING METHOD THEREOF

(71) Applicant: Winbond Electronics Corp., Taichung (TW)

(72) Inventor: Masaru Yano, Yokohama (JP)

(73) Assignee: WINBOND ELECTRONICS CORP., Taichung (TW)

(*) Notice: Subject to any disclaimer, the term of this patent is extended or adjusted under 35 U.S.C. 154(b) by 0 days.

(21) Appl. No.: 17/133,891

(22) Filed: Dec. 24, 2020

(65) Prior Publication Data
US 2021/0210553 A1  Jul. 8, 2021

(30) Foreign Application Priority Data

Jan. 6, 2020  (JP) .............................. JP2020-000228

(51) Int. Cl.
*G11C 13/00* (2006.01)
*H01L 27/24* (2006.01)
*H01L 45/00* (2006.01)

(52) U.S. Cl.
CPC .......... *H01L 27/249* (2013.01); *G11C 13/003* (2013.01); *G11C 13/004* (2013.01);
(Continued)

(58) Field of Classification Search
CPC ... H01L 27/249; H01L 27/2454; H01L 45/08; H01L 45/1683; H01L 27/2463; H01L 27/2481; H01L 45/12; H01L 45/16; H01L 45/122; H01L 45/1226; H01L 45/1233; H01L 45/1253; G11C 13/0007; G11C 13/003; G11C 13/004; G11C 13/0069; G11C 2213/71; G11C 2213/75; G11C 2213/18; G11C 2213/52; G11C 2213/78;
(Continued)

(56) References Cited

U.S. PATENT DOCUMENTS 9,825,100 B2 * 11/2017 Sekino .................... G11C 5/063
10,115,895 B1 * 10/2018 Takaki .................... H01L 29/06
(Continued)

FOREIGN PATENT DOCUMENTS

JP       6553773 B2 *  7/2019  ......... H01L 23/5329
TW   201635387 A    10/2016

*Primary Examiner* — Michael T Tran

(74) *Attorney, Agent, or Firm* — Birch, Stewart, Kolasch & Birch, LLP

(57) ABSTRACT

Provide a resistive random-access memory device having an optimized 3D construction. A resistive random-access memory includes a plurality of pillars, a plurality of bit lines, and a memory cell. The pillars extend vertically along the main surface of the substrate. The bit lines extend in a horizontal direction. The memory cell is formed at the intersection of the pillars and the bit lines. The memory cell includes a gate insulating film, a semiconductor film, and a resistive element. The gate insulating film is formed on the circumference of the pillar. The semiconductor film is formed on the circumference of gate insulating film and provides a channel area. The resistive element is formed on the circumference of the semiconductor film. A first electrode area on the circumference of the resistive element and a second electrode area facing the first electrode area are electrically connected to a pair of adjacent bit lines.

14 Claims, 10 Drawing Sheets

(52) U.S. Cl.
CPC ...... *G11C 13/0007* (2013.01); *G11C 13/0069* (2013.01); *H01L 27/2454* (2013.01); *H01L 45/08* (2013.01); *H01L 45/1683* (2013.01); *G11C 2213/71* (2013.01); *G11C 2213/75* (2013.01)

(58) Field of Classification Search
CPC ............ G11C 2213/79; G11C 13/0026; G11C 13/0028
USPC .................................................. 365/148, 158
See application file for complete search history.

(56) References Cited

U.S. PATENT DOCUMENTS

| | | |
|---|---|---|
| 2015/0340371 A1 | 11/2015 | Lue |
| 2016/0260733 A1* | 9/2016 | Lue ................... H01L 29/66742 |
| 2017/0062523 A1* | 3/2017 | Sekino ................. H01L 27/249 |
| 2017/0301688 A1 | 10/2017 | Lee et al. |
| 2017/0330916 A1 | 11/2017 | Hong et al. |
| 2019/0051663 A1* | 2/2019 | Tsuda ................. H01L 27/11565 |
| 2019/0088717 A1* | 3/2019 | Yeh ........................ H01L 27/249 |
| 2019/0097002 A1* | 3/2019 | Nakanishi ............. H01L 29/456 |
| 2020/0020396 A1* | 1/2020 | Kanamori ........... G11C 13/0069 |
| 2020/0194668 A1* | 6/2020 | Sato .................... H01L 45/1616 |
| 2020/0373330 A1* | 11/2020 | Liebmann ........... H01L 27/1052 |

\* cited by examiner

FIG. 4(A) A-A line cross-section

RESISTIVE MEMORY DEVICE AND MANUFACTURING METHOD THEREOF

CROSS REFERENCE TO RELATED APPLICATIONS

The present application is based on, and claims priority from, Japan Application Serial Number 2020-000228, filed on Jan. 6, 2020, the disclosure of which is hereby incorporated by reference herein in its entirety.

BACKGROUND OF THE INVENTION

Field of the Invention

This invention relates to a resistive memory device using a resistive memory cell, and more particularly, to a three-dimensional structure of an array comprising a resistive memory cell.

Description of the Related Art

The resistive random-access memory (hereinafter referred to as "resistive memory") can randomly select the memory cell according to the row address and the column address, read data from the selected memory cell, or write the data to the selected memory cell. In order to achieve high integration, the technology of manufacturing the resistive memory with a three-dimensional structure has been disclosed in the patent document (for example, US Patent Application Publication No. 2017/0330916). The resistive memory in the patent document as shown in FIG. 1 comprises a pillar 10, word lines 30A, 30B, and complement resistance memory elements 20A, 20B. The pillar 10 extends along the vertical direction as the bit line. The word lines 30A, 30B extend along the horizontal direction. The complement resistance memory elements 20A, 20B are formed at the intersection of the pillar 10 and the word line 30A, 30B. The complement resistance memory elements 20A and 20B each comprise a first semiconductor oxide film 21, a conductive film 22, and a second semiconductor oxide film 23. The first semiconductor oxide film 21 serves as a resistive element. The conductive film 22 serves as an intermediate electrode. The second semiconductor oxide film 23 serves as a resistive element. By physically separating the complement resistance memory elements 20A and 20B, the generation of an unexpected sneak current between the memory elements can be suppressed. However, in order to maintain the reliability of the resistive element, a semiconductor oxide film must be formed with a uniform, constant film thickness, and with good reproducibility. However, the manufacturing process for this is not easy, so it may result in an increase in manufacturing costs or a decrease in yield.

BRIEF SUMMARY OF THE INVENTION

The purpose of the invention is to solve the conventional problems described above, and to provide a resistive memory device having an improved three-dimensional structure.

The resistive memory device according to the invention comprises a plurality of vertical components, a plurality of horizontal components, and a memory cell. The vertical components extend vertically along the main surface of the substrate. The vertical components are made of a semiconductor material that has a first conductivity. The horizontal components extend in a horizontal direction of the main surface of the substrate. The horizontal components are made of a semiconductor material. The memory cell is formed at each intersection of the vertical components and the horizontal components. The memory cell comprises a gate insulating film, a semiconductor film, and a resistive film. The gate insulating film is formed on the circumference of the vertical component. The semiconductor film is formed on the circumference of the gate insulating film. The semiconductor film is made of a semiconductor material that has a second conductivity. The resistive film is formed on the circumference of the semiconductor film. The first electrode area on the circumference of the resistive film and the second electrode area facing the first electrode area are electrically connected to a pair of horizontal components.

According to the invention, a resistive memory device with a less complex three-dimensional memory cell array structure and an easier manufacturing process can be provided by forming the memory cell at each intersection of the vertical components and the horizontal components, and by configuring the memory cell so that the first electrode area and the second electrode area on the circumference of the resistive film are electrically connected to a pair of horizontal components.

BRIEF DESCRIPTION OF THE DRAWINGS

FIG. 3(A) is a perspective view, and FIG. 3(B) is a plan view.

FIG. 4(A) is a schematic cross-sectional view taken along line A-A of FIG. 3(B). FIGS. 4(A)-4(D) illustrate the manufacturing process of the memory cell array of the embodiment.

DETAILED DESCRIPTION OF THE INVENTION

The invention provides a resistive memory comprising a stacked memory cell array (that is, a memory cell array with a three-dimensional structure). The resistive memory of the invention not only has the function of the random-access memory cell, but also has the function of simultaneously accessing a plurality of memory cells. A memory cell formed in a three-dimensional structure comprises an access transistor between a pair of bit lines, and resistive elements formed on both sides of it. Memory cells in the row direction share the bit line between adjacent memory cells, and the memory cells are selected, such that when the memory cell on one side is selected, the memory cell on the other side is unselected, preventing the unexpected sneak path is formed on the selected bit line which is connected to the selected memory cell.

In addition, the three-dimensional structure memory cell array of the invention can be applied to the interleaved array or the interleaved memory. The interleaved array is used as a device, which is used to form the neural network as an AI hardware.

Figure 1:
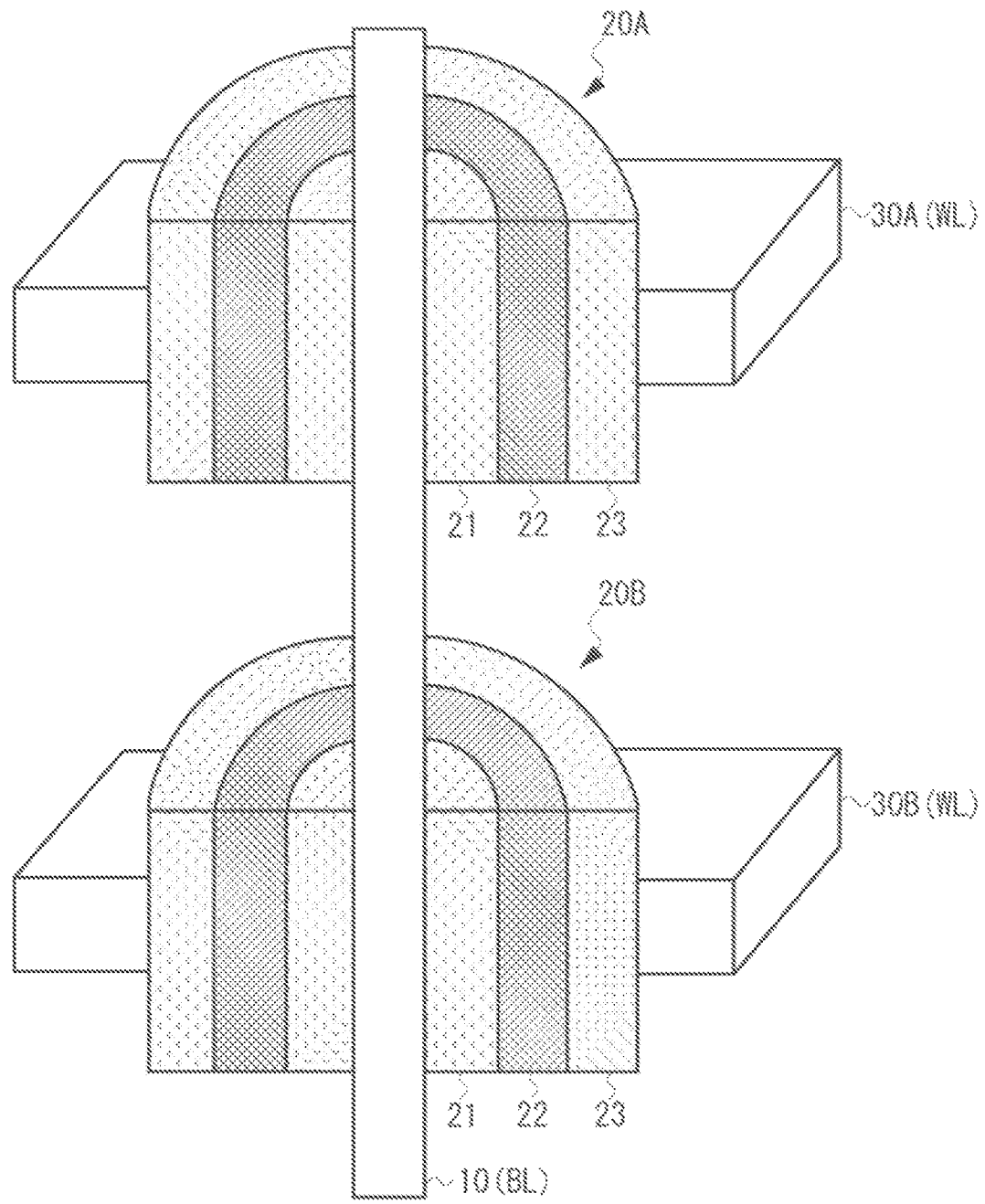
FIG. 1 shows the schematic configuration of a conventional resistive memory having the three-dimensional structure.
Figure 2:
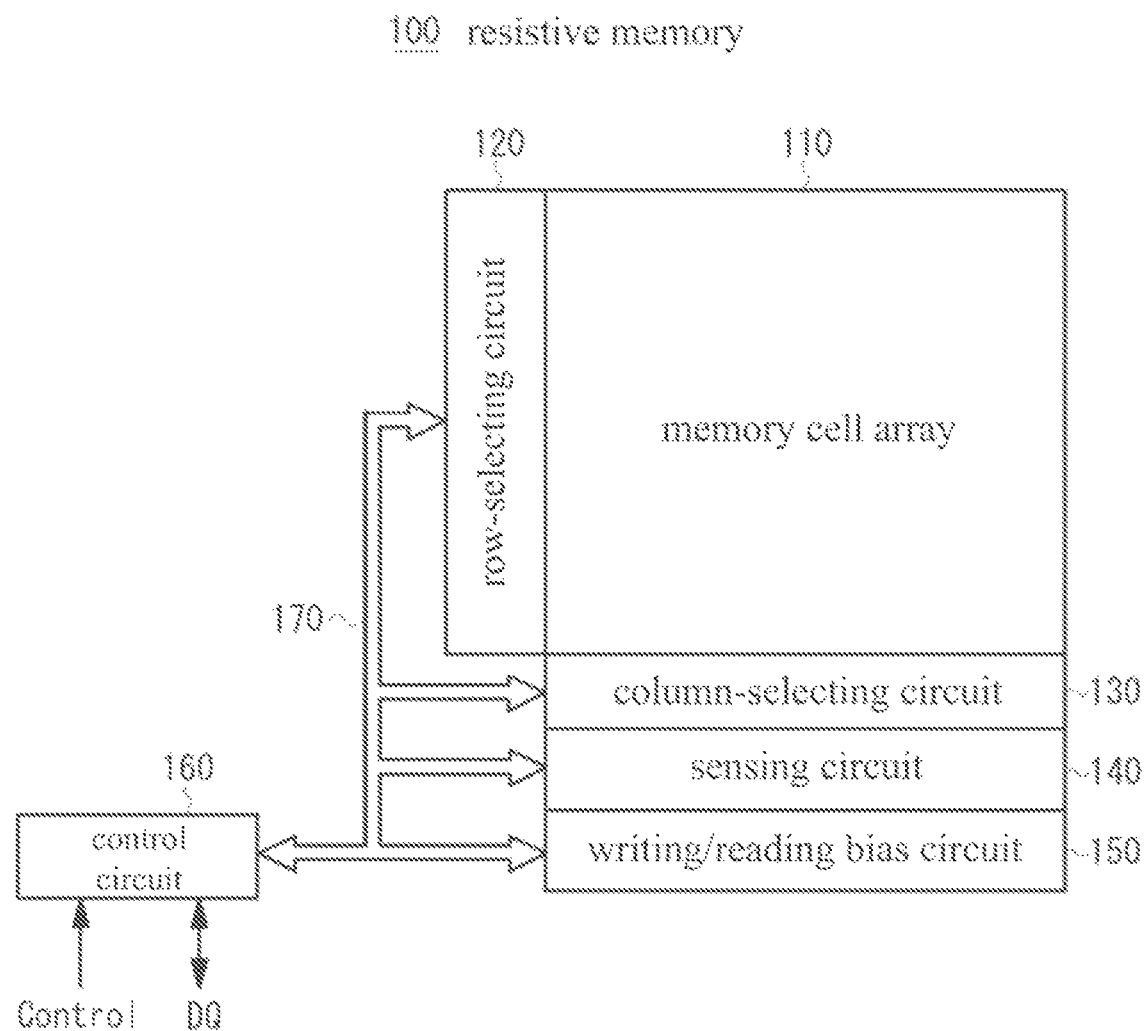
FIG. 2 is a block diagram showing the electrical configuration of the resistive memory of the embodiment of the invention.

FIG. 2 is a block diagram showing the electrical configuration of the resistive memory of the embodiment of the invention. The resistive memory 100 according to the embodiment comprises a memory cell array 110 having the three-dimensional structure, a row-selecting circuit 120, a column-selecting circuit 130, a sensing circuit 140, a writing/reading bias circuit 150, a control circuit 160, and an internal data bus 170 connected to every unit of the resistive memory 100.

Figure 3A:
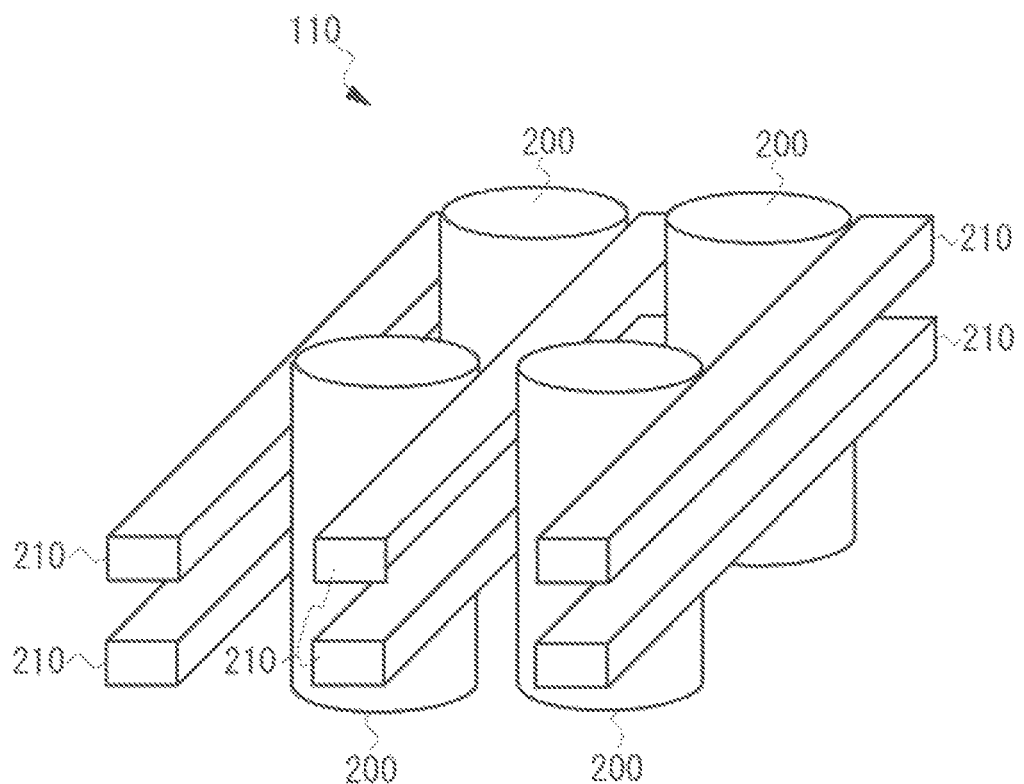
FIGS. 3(A)-3(B) show a part of the schematic configuration of the memory cell array of the resistive memory of the embodiment of the invention.
Figure 3B:
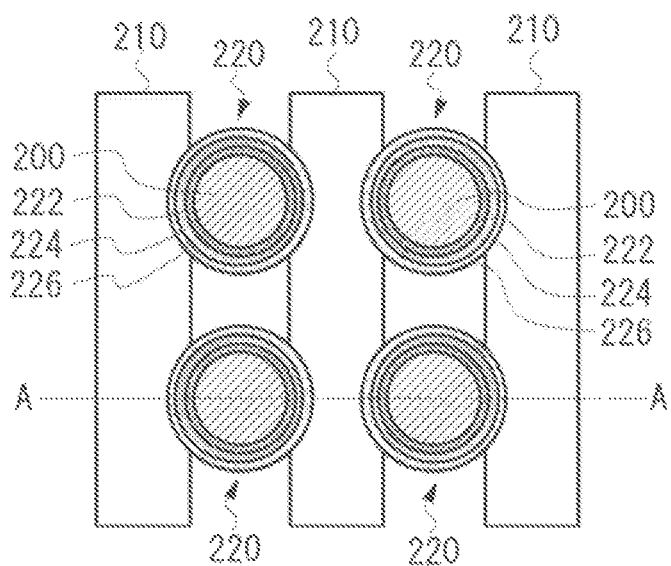

FIG. 3(A) schematically shows a perspective view of a part of the memory cell array 110 according to the embodiment, FIG. 3(B) is a schematic plan view thereof. Four memory cells are illustrated in the figure. The memory cell array 110 comprises a plurality of pillars 200 (there are four pillars in the figure), a plurality of bit lines 210 (there are six bit lines in the figure), and a resistive memory cell 220. The pillar 200 extends along the vertical direction of the main surface of the substrate (such as the silicon substrate, not shown in the figure). The bit line 210 extends along the horizontal direction, and crosses the pillars 200. The resistive memory cell 220 is formed on the intersection of the pillars 200 and the bit lines 210.

For example, the pillar 200 is made of an N-type poly silicon material, and the pillar 200 is electrically connected to the corresponding word line. As shown in FIG. 3(B), the gate insulating film 222 (for example, the silicon oxide film) is formed on the entire circumference of the pillar 200 with a fixed film thickness, and the semiconductor film 224 made of P-type poly silicon material is formed on the entire circumference of the gate insulating film 222. The semiconductor film 224 serves as the channel area of the access transistor, and the inversion layer is formed after the electric field is applied from the pillar 200. In addition, the resistive element 226 is formed on the entire circumference of the semiconductor film 224. The resistive element 226 comprises an inner electrode layer, an outer electrode layer, and a switching layer formed between the electrode layers. The material of the switching layer is the metal oxide, such as $HFO_2$.

For example, the bit line 210 is made of N-type poly silicon material, and is electrically connected to the outer electrode layer of the resistive element 226 at the intersection with the pillar 200. FIG. 4(A) is a cross-sectional view taken along line A-A of the memory cell array in FIG. 3(B).

Figure 4B:
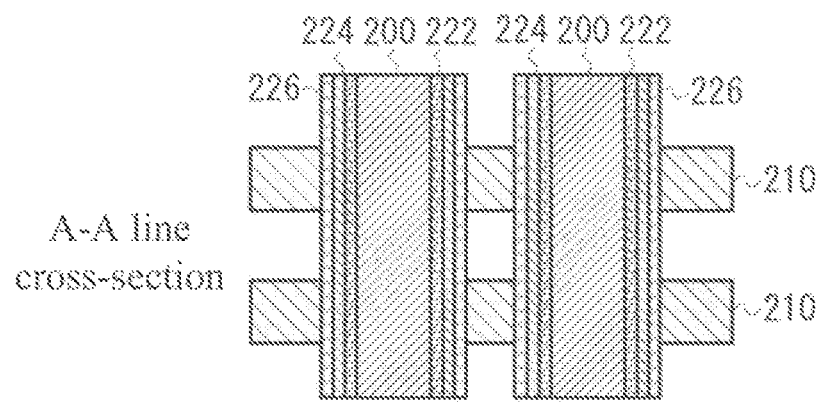
Figure 4B:
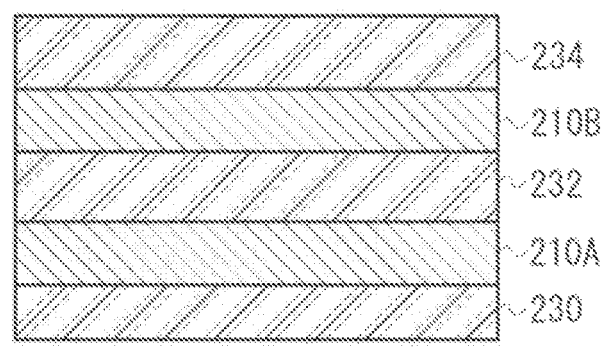
Figure 4C:
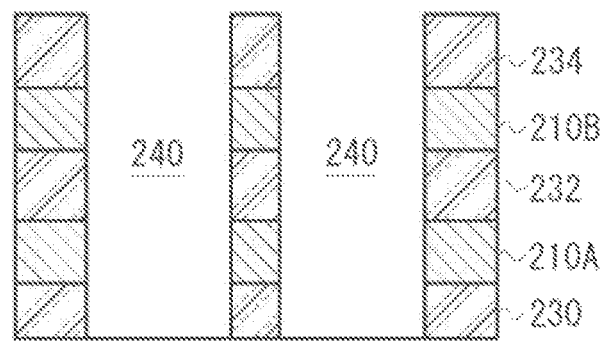

Referring to FIGS. 4(B)-(D), FIGS. 5(E)-(H), FIGS. 6(I)-(K), the method of manufacturing the memory cell shown in FIG. 3 will be described. First, as shown in FIG. 4(B), the interlayer insulating film 230, the lower layer side bit line 210A, the interlayer insulating film 232, the upper layer side bit line 210B, and the interlayer insulating film 234 are sequentially formed on the substrate (not shown). The bit lines 210A and 210B are the N-type poly silicon layer. The interlayer insulating films 230, 232 and 234 are, for example, the silicon oxide or the silicon nitride.

Next, the mask layer is formed on the interlayer insulating film 234 by using the lithography step. The shape and the size of the mask layer define the shape of the pillar 200, for example, if the pillar 200 is cylindrical, the mask layer is formed to the reversed pattern of the circle. The laminated interlayer insulating films 230, 232, 234, and the bit lines 210A and 210B are etched by anisotropic etching through the mask layer, and the opening 240 with the cylindrical shape as shown in FIG. 4) is formed.

Figure 4D:
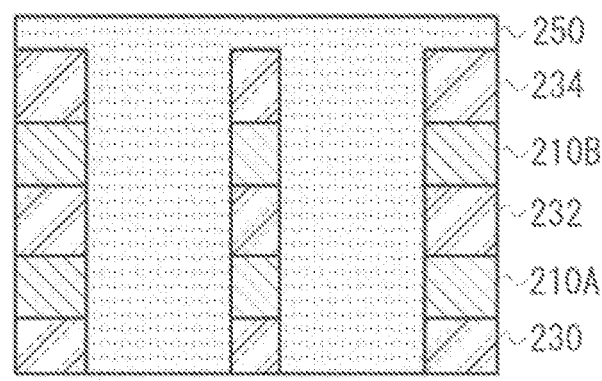
Figure 5E:
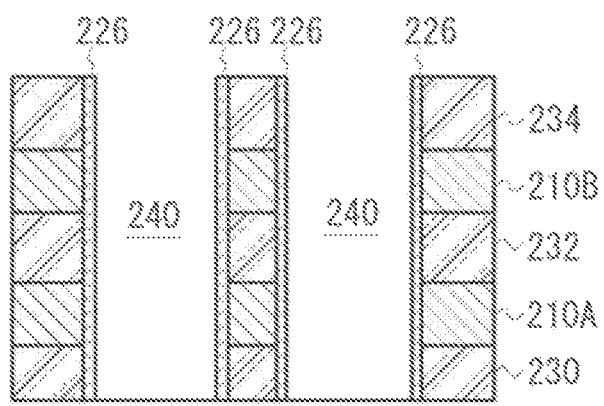
FIGS. 5(E)-5(H) illustrate the manufacturing process of the memory cell array of the embodiment.

Next, the mask layer is removed, as shown in FIG. 4(D), the material layer 250 of the resistive element is entirely formed. The material layer 250 comprises an outer electrode layer, a switching layer (such as $HfO_X$), and the inner electrode layer. Next, the mask layer is formed (not shown), and the mask layer is used for anisotropically and/or isotropically etching the material layer 250, as shown in FIG. 5(E), the resistive element 226 is formed on the sidewall of the opening 240.

Figure 5F:
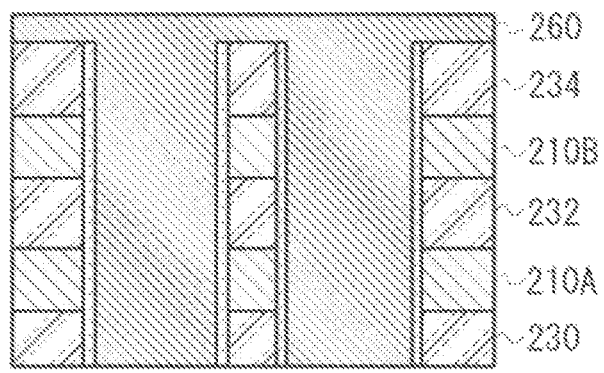
Figure 5G:
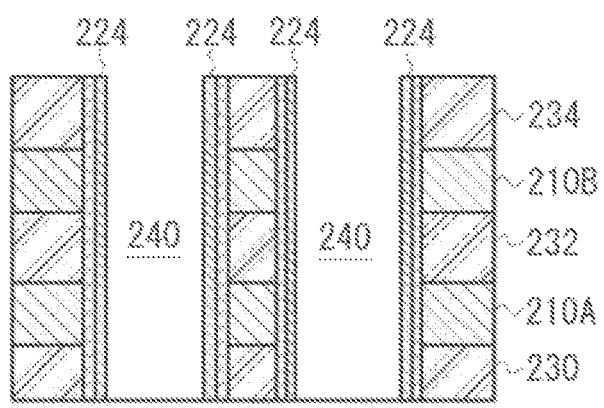

Next, the mask layer is removed, as shown in FIG. 5(F), the P+ poly silicon material 260 is entirely formed. Next, the mask layer is formed (not shown), and the mask layer is used for anisotropically and/or isotropically etching the poly silicon material 260, as shown in FIG. 5(G), the semiconductor layer 224 is formed on the sidewall of the opening 240 and the inner side of the resistive element 226.

Figure 5H:
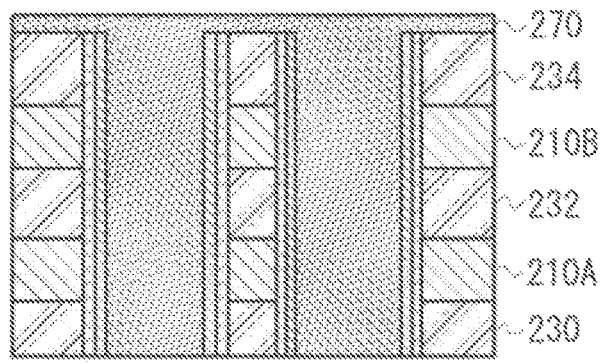
Figure 6I:
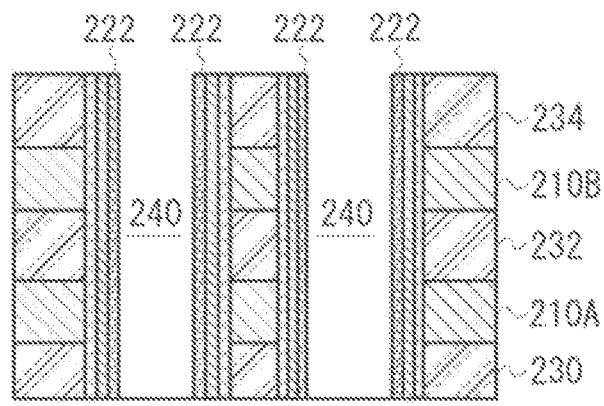
FIGS. 6(I)-6(K) illustrate the manufacturing process of the memory cell array of the embodiment.

Next, the mask layer is removed, as shown in FIG. 5(H), the insulating material 270 like $SiO_2$ is entirely formed. Next, the mask layer is formed (not shown), and the mask layer is used for anisotropically and/or isotropically etching the insulating material 270, as shown in FIG. 6(I), the gate insulating film 222 is formed on the sidewall of the opening 240 and the inner side of the semiconductor layer 224.

Figure 6J:
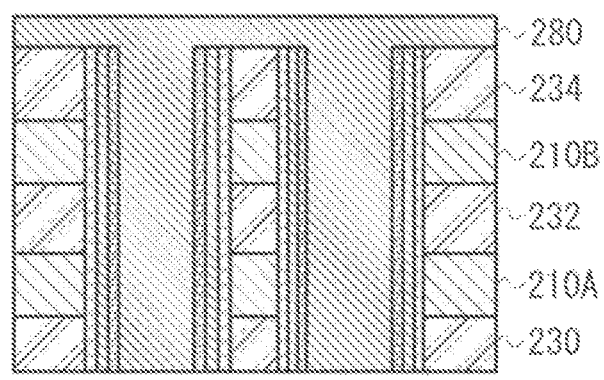
Figure 6K:
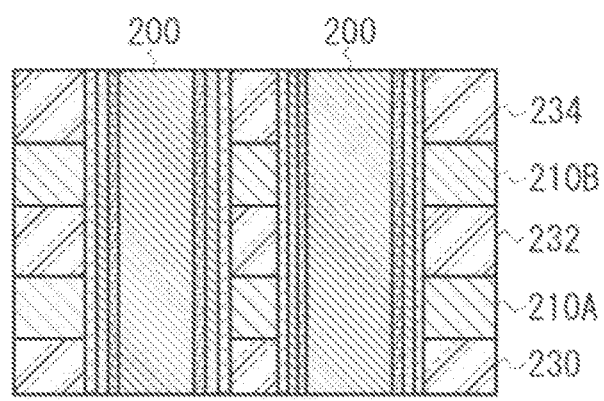

Next, the mask layer is removed, as shown in FIG. 6(J), the N+ poly silicon material 280 is entirely formed. The poly silicon material 280 is etched back or planarized to form the pillar 200 as shown in FIG. 6(K). In addition, in the above manufacturing steps, the bit lines 210A and 210B are formed first, and then the pillar 200 is formed, but it is not limited to this. The bit line 210 can also be formed after the pillar 200, the surrounding gate insulating film 222, the semiconductor film 224 and the resistive element 226. In addition, the memory cell array of the embodiment is manufactured not limited to the above manufacturing method, and can be manufactured by other manufacturing steps.

Refer to FIG. 2 again. The row-selecting circuit 120 selects the word line based on the row address from the control circuit 160, and applies the voltage to the selected word line. The word lines extending along the row direction are electrically connected to the corresponding pillars 200. The column-selecting circuit 130 selects the bit line based on the column address from the control circuit 160. During a reading operation, the sensing circuit 140 senses the flowing current or the voltage of the bit line pair of the memory cell selected by the row-selecting circuit 120 and the column-selecting circuit 130, and outputs the data showing the sensing result to the control circuit 160 through the internal data bus 170. during reading operation, the writing/reading bias circuit 150 applies the bias for reading to the bit line of the selected memory cell. On the other hand, during a writing operation, the writing/reading bias circuit 150 applies the bias for setting or resetting to the bit line pair of the selected memory cell based on the writing data received from the control circuit 160.

The control circuit 160 is configured of hardware and/or software, and controls every unit of the resistive memory 100. In one embodiment, the control circuit 160 comprises the microcontroller, the microprocessor, or the state machine including the ROM/RAM. For example, by performing the software stored in the ROM/RAM, to control the reading operation and the writing operation (setting and resetting) etc. In addition, the control circuit 160 is connected to every unit of the resistive memory 100 through the internal data bus 170. It provides the data received from the outer unit to every unit of the resistive memory 100, or it outputs the reading data received from the sensing circuit 140 to the outer unit.

Figure 7A:
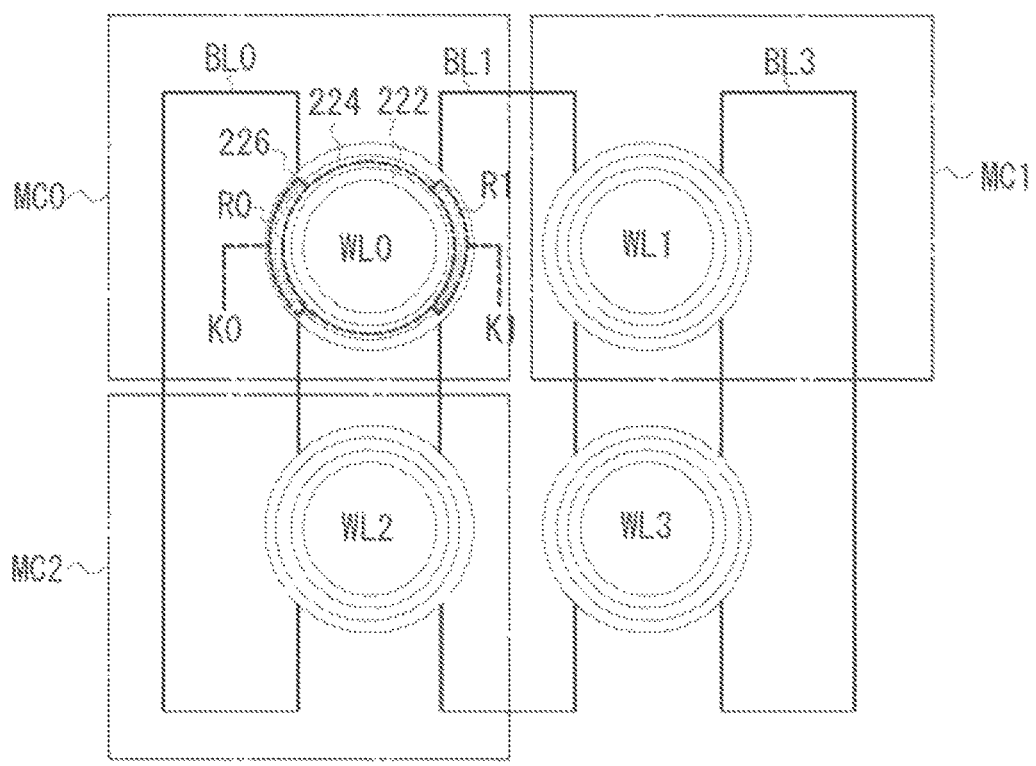
FIGS. 7(A)-7(B) show the connecting relationship between the access transistor and the resistive element after the memory cell is selected in the embodiment.
Figure 7B:
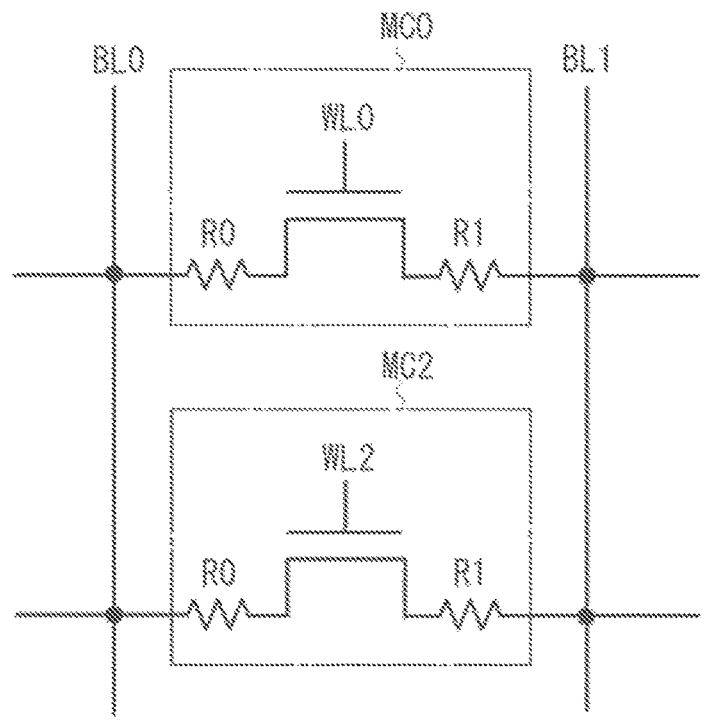

The detailed operation of the resistive memory according to the embodiment is described below. FIGS. 7(A)-(B) show the connecting relationship between the access transistor and the resistive element after one memory cell is selected. Here, we suppose that the word line WL0 connected to the pillar 200 of the memory cell MC0 is selected through the row-selecting circuit 120, and the bit line pair BL0/BL1 is selected through the column-selecting circuit 130. After one positive voltage is applied to the word line WL0, the electric field is applied to the semiconductor layer 224 through the gate insulating film 222, the semiconductor layer 224 is entirely inversed to N-type, and forms the channel area. The result is, the semiconductor layer 224 is electrically connected to the bit line BL0 through the first electrode area on the outer side of the resistive element 226. In addition, the semiconductor layer 224 is electrically connected to the bit line BL1 through the second electrode area facing the first electrode area on the outer side of the resistive element 226.

The resistance parts R0 of the resistive element 226 is formed in the current path K0 between the bit line BL0 and the semiconductor layer 224. The resistance parts R1 of the resistive element 226 is formed in the current path K1 between the bit line BL1 and the semiconductor layer 224. FIG. 7(B) is the equivalent circuit diagram of FIG. 7(A). The selected memory cell MC0 comprises an access transistor between a pair of bit lines BL0/BL1; and two variable resistance R0 and R1 on two sides of the access memory, so the selected memory cell MC0 is configured of 1R1T1R.

The memory cell MC1 adjacent to the memory cell MC0 in the row direction shares the bit line BL1 with the selected memory cell MC0, the bit line WL1 is unselected (applying the GND level or the voltage lower than the threshold value to the bit line WL1), the inversion layer is not formed in the semiconductor layer 224, and the access transistor of the memory cell MC1 is kept turning off. Therefore, the bit line BL1 is actually isolated from the unselected memory cell MC1 to avoid forming the sneak current path.

In addition, the memory cell MC2 adjacent to the memory cell MC0 in the row direction shares a pair of bit lines BL0/BL1 with the selected memory cell MC0, the bit line WL2 is unselected, the PN barrier is formed between the pair of bit line BL0/BL1 and the semiconductor layer 224, and the access transistor is kept turning off. Therefore, the bit line BL0/BL1 pair is actually isolated from the unselected memory cell MC2 (same with the other unselected memory cell which shares the bit line BL0/BL1 pair in the column direction), to avoid forming a sneak current path.

The writing operation of the selected memory cell MC0 will be described. The writing/reading bias circuit 150 performs setting writing or resetting writing to the selected memory cell MC0 based on the writing data from the control circuit 160. During setting writing operation, the row-selecting circuit 120 applies the writing voltage Vset to the selected word line WL0, and applies the GND to the unselected word line. The writing/reading bias circuit 150 applies the setting writing voltage Vs (Vset>Vs) to one side of the selected bit line BL0, and applies the GND to the other side of the selected bit line BL1. By applying the voltage from the bit line BL0 to the bit line BL1, the resistance parts R0 and R1 on the current paths K0 and K1 of the resistive element 226 are programmed to the low resistance state.

In resetting the writing operation, a voltage with a different polarity of the one used in setting the writing operation is applied to the bit line pair BL0/BL1. In other words, the row-selecting circuit 120 applies the writing voltage Vrest to the selected word line WL0, and applies the GND to the unselected word line. The writing/reading bias circuit 150 applies the GND to one side of the selected bit line BL0, and applies the resetting writing voltage Vr (Vrset>Vr) to the other side of the selected bit line BL1. By applying the voltage from the bit line BL1 to the bit line BL0, the resistance parts R1 and R0 on the current paths K1 and K0 of the resistive element 226 are programmed to the high resistance state.

In the reading operation of the selected memory cell MC0, the row-selecting circuit 120 applies a reading voltage Vread to the selected word line WL0, and it applies the GND to the unselected word line. The writing/reading bias circuit 150 applies the reading voltage Vb1 to one side of the selected bit line BL0, and applies the GND to the other side of the selected bit line BL1. If the resistive element is in the low resistive state (setting), the large current flows from the selected bit line BL0 to the selected bit line BL1; if the resistive element is in the high resistive state (resetting), the small current flows from the selected bit line BL0 to the selected bit line Bl1. The sensing circuit 140 senses the current or the voltage of the bit line pair BL0/BL1, serves the corresponding data of the sensing result "0" and "1" as the reading data, and outputs the reading data to the control circuit 160 through the internal data bus 170.

In the above embodiment, the two resistance parts R0 and R1 of the resistive element 226 are used for setting or resetting, and the resistance state of the resistance parts R0 and R1 are read. However, any one of the resistance parts R0 and R1 can also be fixed to the low resistance state, and the remaining one is used as the resistive element. For example, the resistance part R0 is fixed to a low resistance state (setting), and the resistance part R1 is programmed to setting of resetting. For example, a forming voltage larger than the writing voltage used during normal setting/resetting is used to fix the resistance part R0 to a low resistance state (setting). When the bit line BL0 applies the forming voltage to the resistance part R0, the voltage after subtracting the voltage caused by the resistance part R0 from the forming voltage, is applied to the resistance part R1, so the resistance part R1 is not fixed in the low resistance state (setting). After forming, the resistance part R1 can be set or be reset by using the setting writing voltage or the resetting writing voltage which is lower than the forming voltage.

The second embodiment of the invention will be described. In the above embodiment, the example for randomly accessing one memory cell is shown, and the second embodiment is according to the configuration of accessing a plurality of memory cells simultaneously. This kind of the array configuration is suitable for the so-called interleaved array.

Figure 8A:
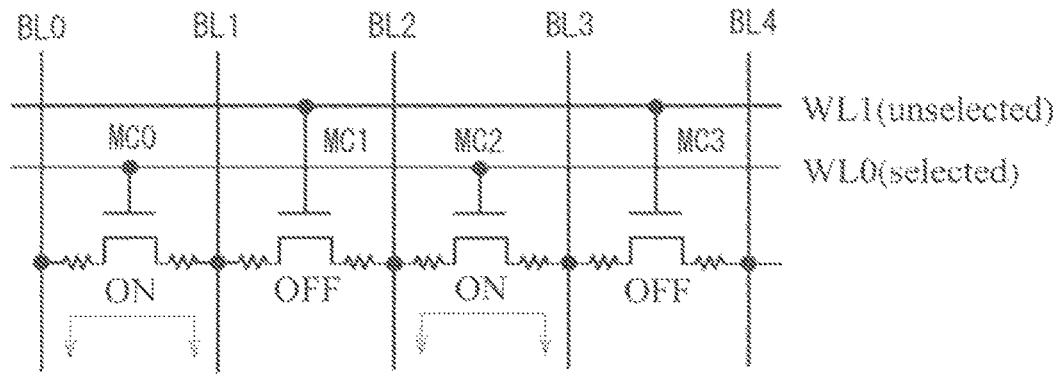
FIGS. 8(A)-8(B) show the configuration of the memory cell according to the second embodiment of the invention.
Figure 8B:
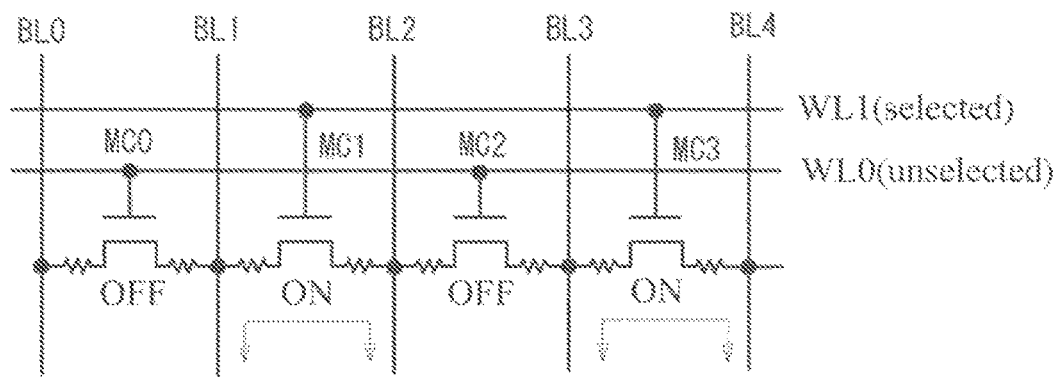

FIG. 8 shows a part of the configuration of the circuit of the memory cell according to the second embodiment. The memory cells MC0-MC3 arranged in the row direction are connected to the word lines WL0 and WL1 interactively, after the word line WL0 is selected, as shown in FIG. 8(A), the access transistor of the memory cells MC0 and MC2 is turned on (in other words, the inversion layer is formed in the semiconductor layer 224). On the other hand, after the word line WL1 is selected, as shown in FIG. 8(B), the access transistor of the memory cells MC1 and MC3 is turned on. The writing/reading bias circuit 150 applies the reading voltage Vb1, the setting writing voltage Vs, and the resetting writing voltage Vr to one side of the selected bit line pair, and the other side of the selected bit line pair is virtual grounded.

When the row-selecting circuit 120 selects one word line, the access transistors of the memory cells connected to the selected word line are turned on at the same time, several data stored in the memory cells can be read at a time, or several data can be written to the memory cells at a time. For example, the input/output of the several data can be used for the matrix operation of the interleaved array.

Although the bit line is shared by memory cells adjacent in the row direction, the unselected memory cell exists between the selected memory cell, the access transistor of the unselected transistor is turned off, the bit line pair of the selected memory cell will not be interfered by the unselected memory cell, and the expected bias can be applied. In addition, although not shown in the figure, the access transistor of the unselected memory cell sharing the bit line in the column direction is also turned off, the selected bit line of the selected memory cell will not be interfered by the unselected memory cell, and the forming of the unexpected sneak current path can be suppressed.

Figure 9:
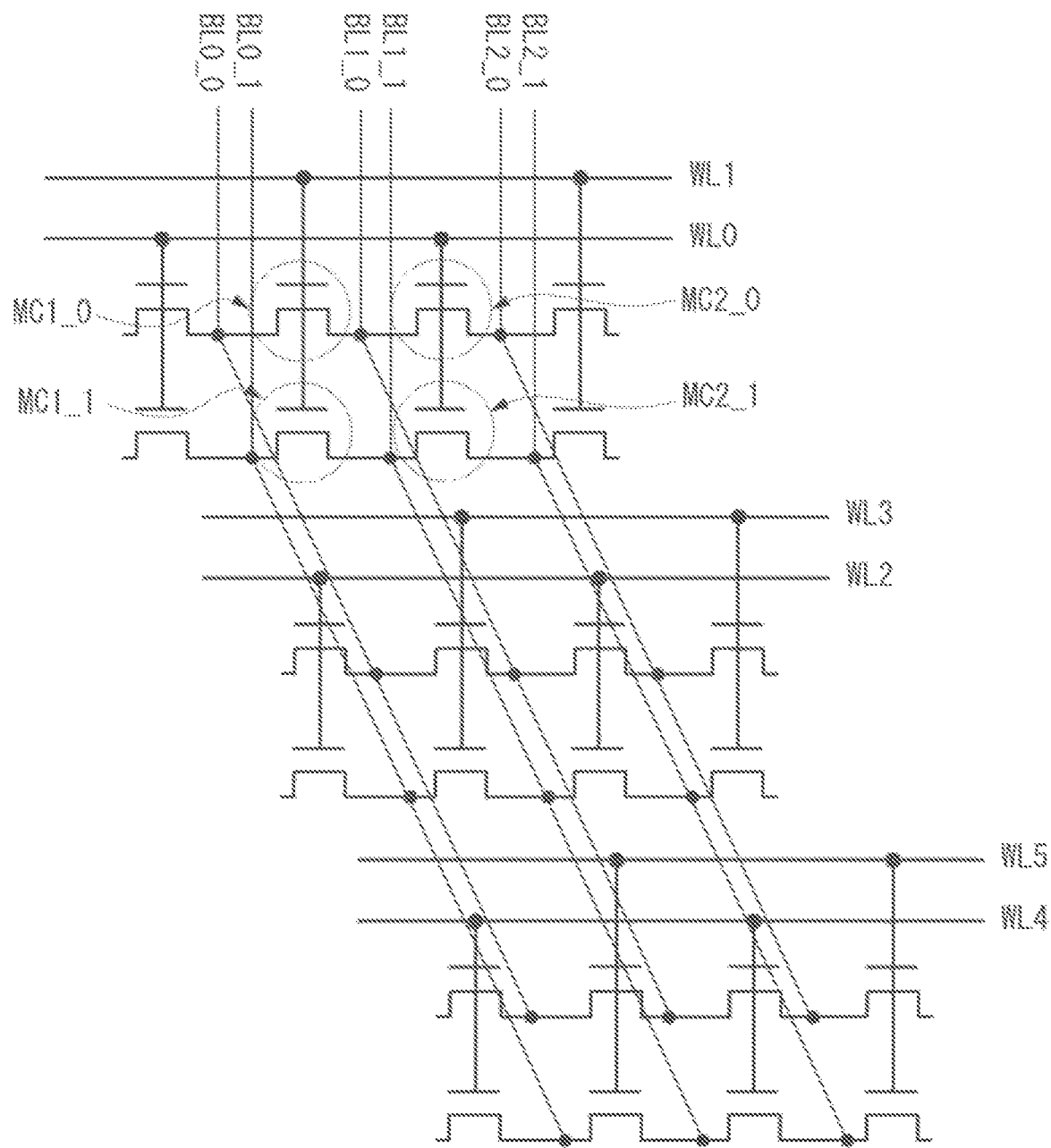
FIG. 9 schematically shows the three-dimensional structure of the memory cell array according to the second embodiment of the invention.

FIG. 9 shows the array configuration shown in FIG. 8, where the two-stage bit lines stacked in the vertical direction are shown here. The basic operation of the array is the same as in FIG. 8. After the selected word line WL0 selects the memory cell MC2_0 and MC2_1, the access transistors of the memory cell MC2_0 and MC2_1 is turned on, and the bit line pair BL1_0/BL2_0 and the bit line pair BL1_1/BL2_1 are selected. After the selected word line WL1 selects the memory cell MC1_0 and MC1_1, the access transistors of the memory cell MC1_0 and MC1_1 is turned on, and the bit line pair BL0_0/BL1_0 and the bit line pair BL0_1/BL1_1 are selected.

Figure 10:
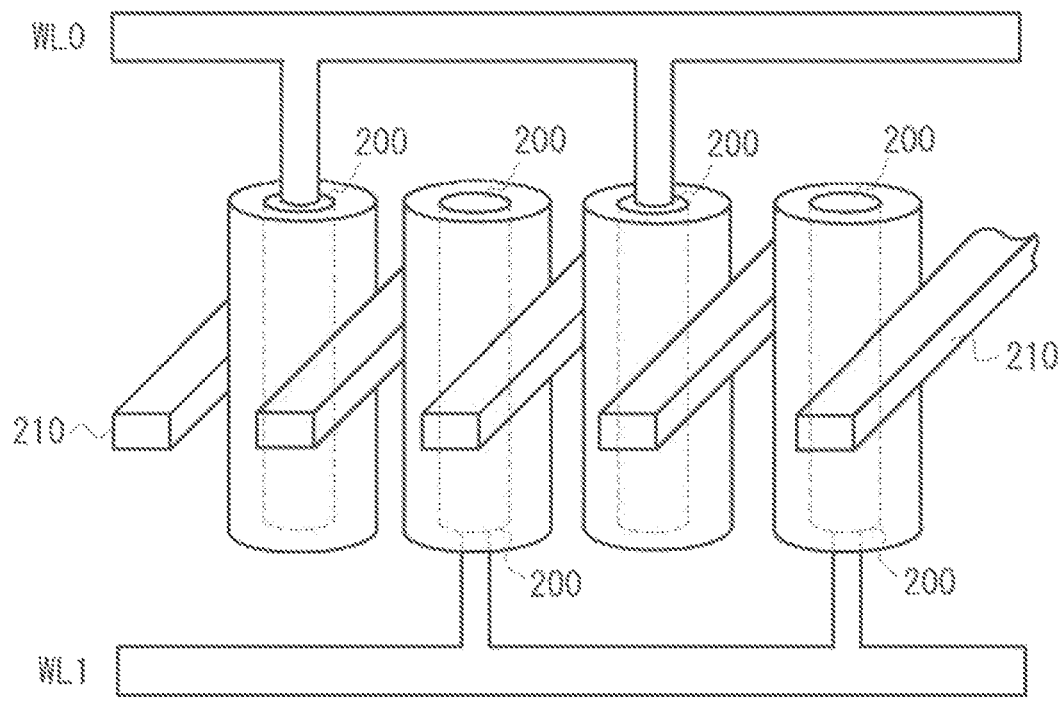
FIG. 10 shows the example of the connection between the pillar and the word line according to the second embodiment of the invention.

FIG. 10 is a schematic cross-sectional view showing the preferred example of the connection between the pillar and the word line of the memory cell array. The word line WL0 is connected to the upper end of the pillars 200 arranged in the row direction at one interval; the word line WL1 is connected to the lower end of the pillars 200 not connected to the word line WL0 at one interval. The word lines WL0 and WL1 can be the conductive poly silicon or the metal layer. Comparing with the condition that the word lines WL0 and WL1 are arranged on the same plane, by connecting the pillar 200 to the word lines WL0 and WL1 interactively along the vertical direction of the pillar 200, it is possible to achieve high integration of the memory cell array, and reduce the area of the memory cell array in the horizontal direction.

Figure 11:
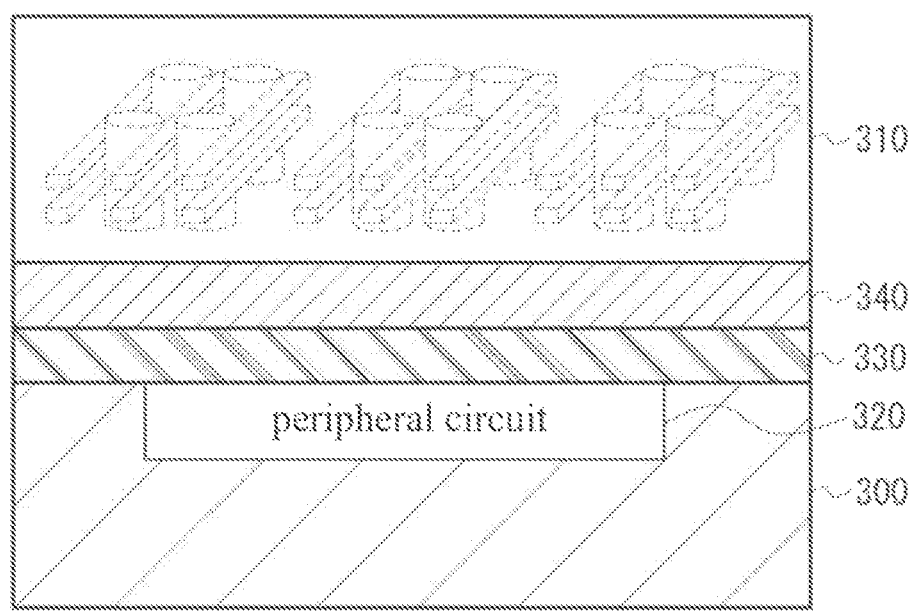
FIG. 11 is a schematic cross-sectional view showing the example which laminates the three-dimensional structure of the memory cell array on the substrate according to the embodiment of the invention.

FIG. 11 is a schematic cross-sectional view showing the example which laminates the memory cell array on the substrate according to the embodiment. For example, the silicon substrate 300 is used as the substrate, the memory cell array 310 with three-dimensional structure is formed on the silicon substrate 300. The peripheral circuit 320 comprising the row-selecting circuit 120, the column-selecting circuit 130, the sensing circuit 140, the writing/reading bias circuit 150 and the control circuit 160 is formed on the surface or inside the silicon substrate 300. The selected pillar 200, the selected bit line 210 and the selected word line of the memory cell array 310, are electrically connected to the row-selecting circuit 120, the column-selecting circuit 130, the sensing circuit 140, the writing/reading bias circuit 150 and the control circuit 160 of the peripheral circuit 320 through the multi-layer wiring structure. The multi-layer wiring structure comprises a plurality of conductive layers (the poly silicon layer and the metal layer), a plurality of interlayer insulating films, the via (or the contact hole) formed in the interlayer insulating film, and the plug contact formed inside the via, which can electrically connected to the laminated bit line or the word line and the peripheral circuit 320 in the vertical direction.

In one embodiment, the insulating layer 330 is formed on the silicon substrate 300, the conductive layer 340 is formed on the insulating layer 330, and the memory cell array 310 is formed on the conductive layer 340. The conductive layer 340 provides the common source (GND level) or the power line to the memory cell array 310. The conductive layer 340 is made of an n-type poly silicon layer, or it is made of a lamination of the metal layer and the n-type poly silicon layer. In this way, by forming the peripheral circuit 320 on the silicon substrate 300, and by laminating the memory cell array 310 on it, the two-dimensional area of the memory chip can be reduced.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:
1. A resistive memory device, comprising:
  a plurality of vertical components, extending along a vertical direction of a main surface of a substrate, and configured of a semiconductor material having first conductivity;
  a plurality of horizontal components, extending along the horizontal direction of the main surface of the substrate, and configured of a semiconductor material; and
  a memory cell, formed at each intersection of the vertical components and the horizontal components;
  wherein the memory cell comprises:
  a gate insulating film, formed on the circumference of the vertical component;
  a semiconductor film, formed on the circumference of the gate insulating film, and configured of a semiconductor material having second conductivity; and
  a resistive film, formed on the circumference of the semiconductor film;
  wherein a first electrode area on the circumference of the resistive film and a second electrode area facing the first electrode area are electrically connected to a pair of horizontal components, and
  wherein when a voltage is applied from the vertical component through the gate insulating film to a semiconductor layer, a channel is formed in the semiconductor film, the pair of horizontal components are electrically connected to each other through the first electrode area, the channel, and the second electrode area.
2. The resistive memory device as claimed in claim 1, wherein the vertical components, the horizontal components, and the semiconductor film are configured of a poly silicon material.

3. The resistive memory device as claimed in claim 1, wherein the vertical components are arranged in the 2-dimensional structure; the horizontal components are arranged in the vertical direction; and the memory cells are arranged in the 3-dimensional structure.

4. The resistive memory device as claimed in claim 1, further comprising:
a row-selecting device, selecting the vertical component based on a row address signal;
a column-selecting device, selecting the horizontal component based on a column address signal; and
a control device, controlling reading or writing of the selected memory cell through the row-selecting device and the column-selecting device;
wherein the control device applies a reading voltage or a writing voltage to one side of the pair of horizontal components connected to the selected memory cell, and applies a reference voltage or GND to the other side.

5. The resistive memory device as claimed in claim 4, wherein the memory cell is randomly selected through the row-selecting device and the column-selecting device.

6. The resistive memory device as claimed in claim 4, wherein the vertical components are connected to the corresponding word lines, and the horizontal components are connected to the corresponding bit lines;
wherein the memory cell is selected by selecting a word line through the row-selecting device, and selecting a bit line through the column-selecting device.

7. The resistive memory device as claimed in claim 6, wherein the edge of one side of an odd-numbered vertical component is electrically connected to a first word line extending along the horizontal direction; and the edge of the other side facing the edge of the one side of an even-numbered component is electrically connected to a second word line extending along the horizontal direction.

8. The resistive memory device as claimed in claim 6, wherein the bit line is shared by memory cells in the row direction, the memory cells in the same row comprise group-one memory cells and group-two memory cells, the group-one memory cells and the group-two memory cells are arranged alternately;
wherein the group-one memory cells are electrically connected to a first word line, and the group-two memory cells are electrically connected to a second word line;
wherein after the group-one memory cells are selected, the group-two memory cells are unselected; and after the group-two memory cells are selected, the group-one memory cells are unselected.

9. The resistive memory device as claimed in claim 8, wherein the control device applies a bias voltage for reading or writing to the selected bit line connected to the selected group-one memory cells or the selected group-two memory cells.

10. The resistive memory device as claimed in claim 1, further comprising:
the substrate; and
a peripheral circuit, formed on the surface of the substrate or formed in the substrate;
wherein the vertical components and the horizontal components are formed on the peripheral circuit;
wherein the vertical components and the horizontal components are electrically connected to the peripheral circuit through a multi-layer wiring structure.

11. The resistive memory device as claimed in claim 10, wherein the multi-layer wiring structure comprises a lamination of a plurality of conductive layers and a plurality of insulating layers; and the selected conductive layer is connected to the vertical component or the horizontal component.

12. The resistive memory device as claimed in claim 10, wherein the peripheral circuit comprises a row-selecting device and a column-selecting device, the row-selecting device selects the vertical component based on a row address signal, and the column-selecting device selects the horizontal component based on a column address signal.

13. A manufacturing method, for manufacturing the resistive memory device as claimed in claim 1, comprising the following steps:
preparing the substrate, and forming the horizontal components and an interlayer insulating film respectively insulated from the horizontal components on the substrate;
forming an opening penetrating the horizontal component and the interlayer insulating film;
forming the resistive film all around the sidewall of the opening;
forming the semiconductor film all around the sidewall of the opening of the resistive film;
forming the gate insulating film all around the sidewall of the opening of the semiconductor film; and
forming the vertical component inside the opening of the gate insulating film.

14. The manufacturing method as claimed in claim 13, wherein the substrate comprises a silicon substrate and an insulating layer; the peripheral circuit is formed on the surface of the silicon substrate, and comprises a row-selecting device, a column-selecting device, and a control device; the memory cell is formed on the insulating layer, and comprises the horizontal components, the vertical components, and the resistive film;
wherein the row-selecting device selects the vertical component based on a row address signal;
wherein the column-selecting device selects the horizontal component based on a column address signal;
wherein the control device controls reading or writing of the selected memory cell through the row-selecting device and the column-selecting device.

* * * * *